(12) United States Patent
Uematsu et al.

(10) Patent No.: US 9,991,421 B2
(45) Date of Patent: Jun. 5, 2018

(54) METHOD FOR MANUFACTURING LIGHT EMITTING DIODE DEVICE

(71) Applicant: KABUSHIKI KAISHA TOSHIBA, Minato-ku (JP)

(72) Inventors: Ikuo Uematsu, Yokohama (JP); Makoto Saito, Yokkaichi (JP); Shinya Ito, Kanazawa (JP); Kengo Furutani, Kanazawa (JP); Shinichi Sasaki, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days. days.

(21) Appl. No.: 15/650,276

(22) Filed: Jul. 14, 2017

(65) Prior Publication Data
US 2018/0026159 A1 Jan. 25, 2018

(30) Foreign Application Priority Data
Jul. 19, 2016 (JP) .................................. 2016-141375

(51) Int. Cl.
*H01L 33/00* (2010.01)
*H01L 33/32* (2010.01)
*C01G 15/00* (2006.01)
*H01L 21/02* (2006.01)

(52) U.S. Cl.
CPC .............. *H01L 33/32* (2013.01); *C01G 15/00* (2013.01); *H01L 21/02019* (2013.01)

(58) Field of Classification Search
CPC .... H01L 33/32; H01L 21/02019; C01G 15/00
USPC ......................................................... 257/103
See application file for complete search history.

(56) References Cited

U.S. PATENT DOCUMENTS

| 5,972,730 A * | 10/1999 | Saito ..................... H01S 5/0201 372/45.01 |
| 9,279,193 B2 * | 3/2016 | D'Evelyn ................. C30B 9/08 |
| 2003/0192859 A1 | 10/2003 | Uematsu et al. |

FOREIGN PATENT DOCUMENTS

JP 3688650 8/2005

* cited by examiner

*Primary Examiner* — Tu-Tu Ho
(74) *Attorney, Agent, or Firm* — Oblon, McClelland, Maier & Neustadt, L.L.P.

(57) ABSTRACT

According to one embodiment, a method for manufacturing an LED device includes forming a laminated semiconductor layer including a GaN layer of a first conductivity type, a GaN-based luminous layer, and a GaN layer of a second conductivity type stacked in this order on a surface of a substrate, forming a resist pattern on the laminated semiconductor layer, subjecting the laminated semiconductor layer to reactive ion etching using the resist pattern as a mask to selectively remove the laminated semiconductor layer to form an LED element structure part and an electrode connection region, removing the resist pattern, and treating the substrate including the LED element structure part and the electrode connection region with a first etching residue removing aqueous solution.

19 Claims, 5 Drawing Sheets

METHOD FOR MANUFACTURING LIGHT EMITTING DIODE DEVICE

CROSS-REFERENCE TO RELATED APPLICATIONS

This application is based upon and claims the benefit of priority from Japanese Patent Application No. 2016-141375, filed Jul. 19, 2016, the entire contents of which are incorporated herein by reference.

FIELD

Embodiments described herein relate generally to a method for manufacturing a light emitting diode device (LED device).

BACKGROUND

An LED device has high reliability, longevity, high luminous efficacy, and high-speed responsiveness as compared with already-existing light sources such as a white lamp, and high-intensity discharge tube, and further has various advantages such as attainable size reduction, and weight reduction, and the like. For this reason, the LED device receives attention as lighting fixture, and is now put to practical use.

In the LED device, an n-type compound-semiconductor layer configured to inject electrons into a luminous layer, and a p-type compound-semiconductor layer configured to inject positive holes into the luminous layer are arranged on a substrate with a luminous layer formed of a compound semiconductor interposed between these compound-semiconductor layers, and the electrons and the positive holes recombine with each other in the luminous layer, whereby light is emitted. Above all, as an LED device capable of emitting white light, a device having a structure provided with an n-type GaN layer, GaN-based luminous layer, and p-type GaN layer receives attention.

Such a GaN-based LED device is, heretofore, manufactured by the method described below.

An n-type GaN layer, GaN-based luminous layer, and p-type GaN layer are stacked in this order on the surface of a substrate, thereby forming a laminated semiconductor layer. A predetermined resist pattern is formed on the laminated semiconductor layer. The laminated semiconductor layer is subjected to reactive ion etching using the resist pattern as a mask, and using, for example, chlorine gas as an etching gas so that the n-type GaN layer remains to have a predetermined thickness on a surface of the substrate. Thereby, an LED element structure part having, for example, a rectangular external shape, and an electrode connection region (contact region) integrated with the n-type GaN layer of the structure part concerned and positioned in the rectangular LED element structure part are formed. Thereafter, the resist pattern is removed.

However, after the resist pattern is removed, residual substance including a polymer, carbonaceous matter, and the like mainly originating from the resist is attached to the surface of the p-type GaN layer which is the uppermost layer of LED element structure part, and on which the resist pattern has been positioned. Further, a residual substance such as an altered layer or the like originating from an oxide of a constituent element of GaN is attached to the LED element structure part provided with the n-type GaN layer, GaN-based luminous layer, and p-type GaN layer in such a manner that the residual substance protrudes from the lateral side of the LED element structure part in the direction to the part at which the resist pattern has existed. Moreover, the residual substance of the altered layer or the like is also attached to the surface of the contact region integrated with the n-type GaN layer in the vicinity of the lateral side of the LED element structure part.

If the residual substance is attached to the surface of the p-type GaN layer of the uppermost layer, when an electrode is formed on the surface of the p-type GaN layer in the subsequent process, the connection resistance of the electrode is increased. Further, if the residual substance is attached to the lateral side ranging over the n-type GaN layer, GaN-based luminous layer, and p-type GaN layer, the efficiency in injecting electrons from the n-type GaN layer into the luminous layer, and the efficiency in injecting positive holes from the p-type GaN layer into the luminous layer are disturbed, and the luminous efficacy is lowered.

Such being the case, heretofore, removing the residual substance by treating the substrate including the LED element structure part obtained after the resist pattern is removed with Clean Strip MF (trade name of a product of Tokyo Ohka Kogyo Co., LTD.) containing an aromatic hydrocarbon, alkylbenzene sulfonic acid, and nonyl phenol is carried out.

DETAILED DESCRIPTION

An embodiment will be described below in detail.

First Embodiment

In general, according to a first embodiment, a method for manufacturing an LED device comprises forming a laminated semiconductor layer including a GaN layer of a first conductivity type, a GaN-based luminous layer, and a GaN layer of a second conductivity type stacked in this order on a surface of a substrate; forming a resist pattern with a predetermined shape on the laminated semiconductor layer; subjecting the laminated semiconductor layer to reactive ion etching using the resist pattern as a mask to selectively remove the laminated semiconductor layer so that the GaN layer of the first conductivity type remains to have a predetermined thickness on a surface of the substrate, thereby forming an LED element structure part and an electrode connection region integrated with the GaN layer of the first conductivity type of the structure part on the substrate; removing the resist pattern; and treating the substrate including the LED element structure part and the electrode connection region with a first etching residue removing aqueous solution containing a peroxosulfate, a fluorine-containing compound, and an acid for pH adjustment, and possessing a pH value of 0 to 3.

Next, the method for manufacturing an LED device according to the first embodiment will be described below in detail.

(First Process)

A laminated semiconductor layer including a GaN layer of a first conductivity type, GaN-based luminous layer, and GaN layer of a second conductivity type stacked one on top of the other in the order mentioned is formed on a surface of a substrate.

As the substrate, for example, a sapphire substrate can be used. The sapphire substrate has lattice matching with GaN which is a compound semiconductor. For this reason, it is possible to form a GaN layer of the first conductivity type, GaN-based luminous layer, and GaN layer of the second conductivity type in this order on the surface of the sapphire substrate by, for example, an epitaxial growth method.

Further, as the substrate, a silicon substrate can also be used. The silicon substrate has lattice mismatch between itself and GaN which is a compound semiconductor, and a GaN layer or the like of the first conductivity type cannot be directly formed on the surface of the silicon substrate. For this reason, lamination is carried out in advance on a III-V semiconductor substrate in the order reverse to the laminated semiconductor layer, i.e., a GaN layer of the second conductivity type, GaN-based luminous layer, and GaN layer of the first conductivity type are formed in the order mentioned by the epitaxial growth method or the like. Furthermore, a thin film (for example, a silicon oxide thin film which is a material identical to the natural oxide film on the silicon substrate surface) is formed on the GaN layer of the first conductivity type of the uppermost layer. Subsequently, the III-V semiconductor substrate is inverted, and the silicon oxide thin film positioned in the lowermost layer is brought into contact with the surface of the natural oxide film of the silicon substrate, thereby joining the III-V semiconductor substrate to the silicon substrate. Thereafter, the III-V semiconductor substrate of the uppermost layer is removed, whereby a laminated semiconductor layer in which the GaN layer of the first conductivity type, GaN-based luminous layer, and GaN layer of the second conductivity type are stacked one on top of the other in the order mentioned is formed on the silicon substrate.

The GaN-based luminous layer can be formed from, for example, InGaN or the like.

(Second Process)

A resist pattern having a predetermined shape is formed on the laminated semiconductor layer.

Subsequently, the laminated semiconductor layer is subjected to reactive ion etching (RIE) using the resist pattern as a mask to selectively remove the laminated semiconductor layer so that the GaN layer of the first conductivity type remains to have a predetermined thickness on a surface of the substrate. At this time, an LED element structure part, and an electrode connection region (contact region) integrated with the GaN layer of the first conductivity type of the structure part are formed on the substrate.

As the reactive gas to be used when the laminated semiconductor layer is subjected to RIE, a chlorine-based gas such as chlorine ($Cl_2$) gas, $BCl_3$, $CCl_4$, and the like can be used.

The LED element structure part is a part formed by stacking the GaN layer of the first conductivity type, GaN-based luminous layer, and GaN layer of the second conductivity type in this order on a surface of the substrate, and the external shape thereof is, for example, rectangular.

The contact region integrated with the GaN layer of the first conductivity type of the LED element structure part can take various shapes enumerated below.

(1) A contact region has a rectangular shape formed by notching the rectangular LED element structure part from the side thereof toward the inside thereof or a shape formed by cutting away the corners of the rectangular shape.

(2) A contact region has a rectangular shape formed by notching the rectangular LED element structure part from the corner thereof toward the inside thereof.

(3) A contact region has a frame-like shape similar to the rectangular LED element structure part on the outer periphery of the rectangular LED element structure part.

The electrode to be connected to the contact region of item (1) or (2) can be made, for example, circular, rectangular, or polygonal. The electrode to be connected to the contact region of item (3) can be made, for example, rectangularly annular.

(Third Process)

The resist pattern is removed by, for example, oxygen ashing. After the resist pattern is removed, a residual substance constituted of a polymer, carbonaceous matter, and the like mainly originating from the resist is attached to the surface of the GaN layer of the second conductivity type which is the uppermost layer of the LED element structure part, and which has been covered with the resist pattern. Further, to the lateral side of the rectangular LED element structure part provided with the GaN layer of the first conductivity type, GaN-based luminous layer, and GaN layer of the second conductivity type, a residual substance having, for example, a fence-like shape constituted of an altered layer is attached, and the residual substance protrudes in the direction to the part at which the resist pattern has existed. The altered layer is originated from the resist, reactive gas, constituent element of GaN, and oxygen.

Subsequently, the substrate including the LED element structure part and the electrode connection region is treated with a first etching residue removing aqueous solution containing a peroxosulfate, fluorine-containing compound, and acid for pH adjustment, and having a pH value of 0 to 3, thereby removing the residual substance.

A function or the like of each of the ingredients of the first etching residue removing aqueous solution will be described below.

1) Peroxosulfate

Examples of the peroxosulfate include a peroxomonosulfate, and peroxodisulfate. As the peroxodisulfate, for example, ammonium peroxodisulfate is included.

The peroxosulfate has a function of decomposing and removing the residual substance constituted of a polymer and carbonaceous matter originating from the resist which is an etching residue, and protecting the rectangular LED element structure part on the substrate and provided with the GaN layer of the first conductivity type, GaN-based luminous layer, and GaN layer of the second conductivity type, and the contact region integrated with the GaN layer of the first conductivity type from etching using the fluorine-containing compound.

It is desirable that the peroxosulfate, for example, the ammonium peroxodisulfate be contained in the first etching residue removing aqueous solution at a concentration of 0.01 mol/L to 20 mol/L.

If the amount of the ammonium peroxodisulfate is made less than 0.01 mol/L, there is a possibility of the function of decomposing and removing the residual substance constituted of the polymer and carbonaceous matter originating from the resist, and protecting the rectangular LED element structure part and the like from etching becoming difficult to be carried out. On the other hand, if the amount of the ammonium peroxodisulfate exceeds 20 mol/L, there is a possibility of oxidation of the lateral side and the like of the rectangular LED element structure part provided with the GaN layer of the first conductivity type, GaN-based luminous layer, and GaN layer of the second conductivity type being excessively advanced. The more desirable content of the ammonium peroxodisulfate in the first etching residue removing aqueous solution is 0.1 mol/L to 0.5 mol/L.

2) Fluorine-Containing Compound

Examples of the fluorine-containing compound include hydrofluoric acid, and ammonium acid fluoride.

The fluorine-containing compound has a function of removing a residual substance constituted of an oxide and the like.

The function of removing the residual substance constituted of an oxide and the like will be described next by taking the hydrofluoric acid (HF) as an example.

The hydrofluoric acid dissociates as expressed by the following formulae (1) and (2) in the presence of water. However, this dissociative reaction is an equilibrium reaction.

$$HF \Leftrightarrow H^+ F^- \quad (1)$$

$$F^- + HF \Leftrightarrow HF_2^- \quad (2)$$

Although HF before dissociation of the formula (1) has a weak etching function for GaN or an oxide thereof, $HF_2^-$ of the formula (2) has a strong etching function for GaN or an oxide thereof. For this reason, when a large amount of $HF_2^-$ exists in the first etching residue removing aqueous solution, the function of the peroxosulfate protecting the rectangular LED element structure part and the contact region integrated with the GaN layer of the first conductivity type from etching by the fluorine-containing compound is lowered. For reasons described above, it is possible to control creation of the $HF_2^-$ in the first etching residue removing aqueous solution by adjusting the pH of the solution by means of the acid for pH adjustment to be described later.

It is desirable that the fluorine-containing compound be contained in the first etching residue removing aqueous solution at a concentration of $5\times10^{-6}$ mol/L to $5\times10^{-1}$ mol/L. If the amount of the fluorine-containing compound is made less than $5\times10^{-6}$ mol/L, there is a possibility of removal of the residual substance constituted of an altered layer originating from the oxide of a constituent element of GaN becoming difficult. On the other hand, if the amount of the fluorine-containing compound exceeds $5\times10^{-1}$ mol/L, the creation amount of $HF_2^-$ in the first etching residue removing aqueous solution becomes large, and there is a possibility of a change in shape and film reduction being caused by the etching of the rectangular LED element structure part and the contact region. The more desirable content of the fluorine-containing compound in the first etching residue removing aqueous solution is $1\times10^{-4}$ mol/L to $1\times10^{-2}$ mol/L.

3) Acid for pH Adjustment

Examples of the acid for pH adjustment include inorganic acids such as sulfuric acid, nitric acid, hydrochloric acid, and phosphoric acid, or organic acids such as acetic acid, and oxalic acid. Particularly, the sulfuric acid is desirable.

It is possible to adjust the pH value of the first etching residue removing aqueous solution to 0 to 3 by the acid for pH adjustment. As described above, by making the first etching residue removing aqueous solution strongly acidic, the hydrogen-ion ($H^+$) concentration in the aqueous solution is increased, and the equilibrium reaction of the HF of the formula (1) is made to shift to the left side, i.e., the equilibrium reaction is made to shift to increase the amount of the HF, and consequently the equilibrium reaction of the formula (2) is prevented from shifting to the right side, and the amount of the $HF_2^-$ created in the aqueous solution can be controlled and normalized.

The more desirable pH value of the first etching residue removing aqueous solution is 0 to 2.

It is desirable that the first etching residue removing aqueous solution be used at a liquid temperature from 20 to 35° C.

It should be noted that in the manufacture of the LED device of the first embodiment described previously, after the treatment using the first etching residue removing aqueous solution, treatment using a water-soluble organic solvent such as alcohol or pure water is allowed to be further carried out.

As described above, according to the first embodiment, the laminated semiconductor layer including the GaN layer of the first conductivity type, GaN-based luminous layer, and GaN layer of the second conductivity type stacked one on top of the other in the order mentioned is formed on the substrate, the laminated semiconductor layer is subjected to reactive ion etching (RIE) using the resist pattern as a mask to selectively remove the laminated semiconductor layer, thereby forming the LED element structure part and the electrode connection region (contact region) integrated with the GaN layer of the first conductivity type of the structure part on the substrate. Subsequently, after the resist pattern is removed, the substrate is treated with the first etching residue removing aqueous solution containing the peroxosulfate, fluorine-containing compound, and acid for pH adjustment, and having a pH value of 0 to 3. By the treatment described above, the residual substance constituted of a polymer, and carbonaceous matter originating from the resist and attached to the surface of the GaN layer of the second conductivity type positioned in the uppermost layer of the LED element structure part at the time of the RIE, and the residual substance having, for example, a fence-like shape constituted of an altered layer originating from the resist, reactive gas, constituent element of GaN, and oxygen, and attached to the lateral side of the LED element structure part in such a manner that the residual substance protrudes from the lateral side in the direction to the part at which the resist pattern has existed can be removed, and cleanliness can be achieved. Further, in the treatment using the first etching residue removing aqueous solution, it is possible to prevent a change in dimension of the LED element structure part, and the contact region integrated with the GaN layer of the first conductivity type of the structure part caused by etching, and film reduction or the like of the uppermost layer of the LED element structure part and the GaN layer of the contact region from occurring.

That is, it is possible, at the time of carrying out the treatment using the first etching residue removing aqueous solution, to remove the residual substance constituted of a polymer, and carbonaceous matter originating from the resist, and attached to the surface of the GaN layer of the second conductivity type in the uppermost layer of the LED element structure part by the oxidation function of the peroxosulfate.

Further, it is possible to remove the residual substance constituted of an altered layer originating from the resist, reactive gas, constituent element of GaN, and oxygen, and attached to the lateral side of the LED element structure part, and to the contact region in the vicinity of the lateral side thereof by means of the fluorine-containing compound (for example, hydrofluoric acid) in the aqueous solution. At this time, by means of the acid for pH adjustment in the aqueous solution, the pH value of the aqueous solution is adjusted to 0 to 3, whereby creation of $HF_2^-$ having strong etching capability from the fluorine-containing compound (for example, hydrofluoric acid) in the aqueous solution concerned is controlled, and the amount of the $HF_2^-$ can be normalized. Therefore, it is possible to efficiently remove the residual substance while controlling etching of, for example, the LED element structure part and the GaN of the contact region by virtue of the HF having weak etching capability and the appropriate amount of the $HF_2^-$.

At the time of carrying out the treatment using the first etching residue removing aqueous solution, both the LED element structure part and the contact region are exposed to the aqueous solution, and are subjected to the etching operation carried out by the fluorine-containing compound (for example, hydrofluoric acid) in the aqueous solution. At this time, the surfaces of the LED element structure part and the like are protected from the hydrofluoric acid by the oxidation function of the peroxosulfate and, as described previously, creation of the $HF_2^-$ having strong etching capability is controlled, and the $HF_2^-$ amount is normalized, and hence it is possible to resolve the disadvantage of suffering from a change in dimension, and film reduction caused by the etching of the LED element structure part and the contact region.

Accordingly, by forming the LED element structure part on the substrate and the contact region integrated with the GaN layer of the first conductivity type of the structure part concerned, and carrying out the treatment using the first etching residue removing aqueous solution after removing the resist pattern, it is possible to remove the residual substance constituted of the polymer, and carbonaceous matter originating from the resist and attached to the surface of the GaN layer of the second conductivity type in the uppermost layer of the LED element structure part at the time of the reactive ion etching (RIE), and the fence-like residual substance constituted of the altered layer originating from the resist, reactive gas, constituent element of GaN, and oxygen, and attached to the lateral side of the LED element structure part to thereby achieve cleanliness without a change in dimension, and film reduction due to etching of the LED element structure part and the contact region being caused.

Particularly, by carrying out the treatment using the first etching residue removing aqueous solution containing 0.01 mol/L to 20 mol/L of ammonium peroxodisulfate, $5 \times 10^{-6}$ mol/L to $5 \times 10^{-1}$ mol/L of a fluorine-containing compound, and acid for pH adjustment, and having a pH value of 0 to 3, it is possible to more securely remove the residual substance and achieve high cleanliness.

As a result, it is possible to provide an electrode on the clean surface of the GaN layer of the second conductivity type positioned in the uppermost layer of the LED element structure part, and hence it becomes possible to connect the electrode to the GaN layer with low resistance. Further, it is possible to provide another electrode on the clean contact region of the first conductivity type, and hence it becomes possible to connect another electrode to the contact region concerned with low resistance.

Further, it is possible, in addition to the dimension stability of the LED element structure part, to clean the lateral side thereof. Accordingly, the efficiency in injecting electrons from the GaN layer of the first conductivity type (for example, n-type) into the luminous layer, and the efficiency in injecting positive holes from the GaN layer of the second conductivity type (for example, p-type) into the luminous layer are kept at the intended value, and high luminous efficacy can be achieved.

Accordingly, it is possible to manufacture an LED device regarding which low resistance connection of the electrode, high reliability, and high luminous efficacy are expected.

Second Embodiment

In general, according to a second embodiment, a method for manufacturing an LED device comprises forming a laminated semiconductor layer including a GaN layer of a first conductivity type, a GaN-based luminous layer, and a GaN layer of a second conductivity type stacked in this order on a surface of a substrate; forming a resist pattern with a predetermined shape on the laminated semiconductor layer; subjecting the laminated semiconductor layer to reactive ion etching using the resist pattern as a mask to selectively remove the laminated semiconductor layer so that the GaN layer of the first conductivity type remains to have a predetermined thickness on a surface of the substrate, thereby forming an LED element structure part and an electrode connection region integrated with the GaN layer of the first conductivity type of the structure part on the substrate; removing the resist pattern; treating the substrate including the LED element structure part and the electrode connection region with a first etching residue removing aqueous solution containing a peroxosulfate, a fluorine-containing compound, and an acid for pH adjustment, and possessing a pH value of 0 to 3; forming a protection film on the entire surface of the LED element structure part including the electrode connection region; forming a resist pattern in which a part corresponding to part of the GaN layer of the second conductivity type of the LED element structure part, and a part corresponding to part of the electrode connection region are opened on the surface of the protection film, on the LED element structure part including the electrode connection region; subjecting the protection film to reactive ion etching using the resist pattern as a mask to selectively remove the protection film, thereby forming a first extraction hole for a second conductivity type electrode in the protection film on the GaN layer of the second conductivity type of the LED element structure part, and forming a second extraction hole for a first conductivity type electrode in the protection film on the electrode connection region; removing the resist pattern; treating the protection film including the first and the second extraction holes with a second etching residue removing aqueous solution containing a peroxosulfate, a fluorine-containing compound, and an acid for pH adjustment, and possessing a pH value of 0 to 3; and forming a second conductivity type electrode to be connected to the GaN layer of the second conductivity type of the LED element structure part through the first extraction hole and a first conductivity type electrode to be connected to the electrode connection region through the second extraction hole.

The method for manufacturing an LED device according to the second embodiment will be described below in succession to the third process of the first embodiment described previously.

(Fourth Process)

A protection film is formed on the entire surface of the rectangular LED element structure part including the electrode connection region (contact region) on the substrate.

As the protection film, for example, a silicon nitride film (SiN film) can be used. The protection film can be formed by, for example, the CVD method, and sputtering method.

It should be noted that before forming the protection film, forming a transparent electrode layer of the second conductivity type on the surface of the GaN layer of the second conductivity type in the uppermost layer of the LED element structure part by, for example, the lift-off method is allowed. As the transparent electrode of the second conductivity type concerned, for example, tin-doped indium oxide (ITO) can be used.

(Fifth Process)

A resist pattern in which a part corresponding to part of the GaN layer (or the transparent electrode layer of the second conductivity type) of the second conductivity type of the LED element structure part, and a part corresponding to part of the contact region are opened, is formed on the surface of the protection film on the LED element structure part including the contact region. Subsequently, the protection film is subjected to reactive ion etching (RIE) using the resist pattern as a mask to selectively remove the protection film, thereby forming a first extraction hole for a second conductivity type electrode in the protection film on the GaN layer (or the transparent electrode layer of the second conductivity type) of the second conductivity type of the LED element structure part, and a second extraction hole for a first conductivity type electrode in the protection film on the electrode connection region.

As the reactive gas to be used when the protection film (for example, a silicon nitride film) is subjected to RIE, a fluorine-based gas such as sulfur fluoride ($SF_6$) gas, $CF_4$, $CHF_3$, and the like can be used.

(Sixth Process)

The resist pattern is removed by, for example, oxygen ashing. After the resist pattern is removed, a residual substance constituted of a polymer and carbonaceous matter mainly originating from the resist is attached to the surface of the protection film except each of the first and second extraction holes. Further, a residual substance having, for example, a fence-like shape constituted of an altered layer originating from the resist, reactive gas, constituent element of SiN constituting the protection film, and oxygen is attached to the inner circumferential surface of each of the first and second extraction holes in a state where the residual substance protrudes in the direction to the part at which the resist pattern has existed.

Subsequently, the protection film including the first extraction hole and the second extraction hole is treated with a second etching residue removing aqueous solution containing a peroxosulfate, fluorine-containing compound, and acid for pH adjustment, and having a pH value of 0 to 3, whereby the residual substance is removed.

The function or the like of each ingredient of the second etching residue removing aqueous solution is identical to the first etching residue removing aqueous solution described in the first embodiment.

As described previously, the hydrofluoric acid dissociates as expressed by the following formulae (1) and (2) in the presence of water. However, this dissociative reaction is an equilibrium reaction.

$$HF \rightleftharpoons H^+ F^- \quad (1)$$

$$F^- + HF \rightleftharpoons HF_2^- \quad (2)$$

Although HF before dissociation of the formula (1) has a weak etching function on nitride such as GaN and SiN, $HF_2^-$ of the formula (2) has a strong etching function on nitride such as GaN and SiN. For this reason, when a large amount of $HF_2^-$ exists in the etching residue removing aqueous solution, not only the protection film of SiN exposed at the inner circumferential surface of each electrode extraction hole is etched, but also the function of the peroxosulfate protecting the GaN layer (or the transparent electrode layer) exposed at the bottom surface of the electrode extraction hole from etching by the fluorine-containing compound is lowered. For reasons described above, creation of the $HF_2^-$ in the second etching residue removing aqueous solution is controlled by adjusting the pH by means of the acid for pH adjustment to be described later.

It is desirable that the fluorine-containing compound be contained in the second etching residue removing aqueous solution at a concentration of $5\times10^{-6}$ mol/L to $5\times10^{-1}$ mol/L. If the amount of the fluorine-containing compound is made less than $5\times10^{-6}$ mol/L, there is a possibility of removal of the residual substance constituted of an altered layer originating from the resist, reactive gas, constituent element of SiN constituting the protection film, and oxygen becoming difficult. On the other hand, if the amount of the fluorine-containing compound exceeds $5\times10^{-1}$ mol/L, the creation amount of $HF_2^-$ in the second etching residue removing aqueous solution becomes large, and there is a possibility of etching of the protection film of SiN exposed at the inner circumferential surface of each electrode extraction hole, and etching of the GaN layer (or the transparent electrode layer) exposed at the bottom surface of the electrode extraction hole being caused. The more desirable content of the fluorine-containing compound in the second etching residue removing aqueous solution is $1\times10^{-4}$ mol/L to $1\times10^{-2}$ mol/L.

It is possible to adjust the pH value of the second etching residue removing aqueous solution to 0 to 3 by the acid for pH adjustment. As described above, by making the second etching residue removing aqueous solution strongly acidic, the hydrogen-ion ($H^+$) concentration in the aqueous solution is increased, and the equilibrium reaction of the HF of the formula (1) is made to shift to the left side, i.e., the equilibrium reaction is made to shift to increase the amount of the HF, and consequently the equilibrium reaction of the formula (2) is prevented from shifting to the right side, and the amount of the $HF_2^-$ created in the aqueous solution can be controlled and normalized.

It should be noted that in the manufacture of the LED device of the second embodiment described previously, after the treatment using the second etching residue removing aqueous solution, treatment using a water-soluble organic solvent such as alcohol or pure water is allowed to be further carried out.

(Seventh Process)

A second conductivity type electrode to be connected to the GaN layer (or the transparent electrode layer of the second conductivity type) of the second conductivity type of the LED element structure part through the first extraction hole, and a first conductivity type electrode to be connected to the contact region through the second extraction hole are each formed by the patterning technique.

The first conductivity type electrode (for example, the n-type electrode) can be formed of a laminated metal constituted of, for example, Al, Ti, and Pt.

The second conductivity type electrode (for example, the p-type electrode) can be formed of a laminated metal constituted of, for example, Ti, Pt, and Au.

As described above, according to the second embodiment, as in the aforementioned first embodiment, the residual substance constituted of a polymer, and carbonaceous matter originating from the resist and attached to the surface of the GaN layer of the second conductivity type in the uppermost layer of the LED element structure part on the substrate at the time of the reactive ion etching (RIE), and the residual substance having, for example, a fence-like shape, constituted of an altered layer originating from the resist, reactive gas, constituent element of GaN, and oxygen, and attached to the lateral side of the LED element structure part in such a manner that the residual substance protrudes from the lateral side in the direction to the part at which the resist pattern has existed can be removed, and cleanliness can be achieved.

Further, according to the second embodiment, the protection film is formed on the entire surface of the LED element structure part including the contact region, the protection film is subjected to reactive ion etching (RIE) using the resist pattern in which a part corresponding to part of the GaN layer of the second conductivity type of the LED element structure part, and a part corresponding to part of the contact region are opened as a mask to selectively remove the protection film, the first extraction hole for the second conductivity type electrode is formed in the protection film on the GaN layer of the second conductivity type of the LED element structure part, and the second extraction hole for the first conductivity type electrode is formed in the protection film on the contact region, and after the resist pattern is removed, the protection film is treated with the second etching residue removing aqueous solution containing a peroxosulfate, fluorine-containing compound, and acid for pH adjustment, and having a pH value of 0 to 3. By the treatment described above, it is possible to remove the residual substance constituted of a polymer and carbonaceous matter mainly originating from the resist, and attached to the surface of the protection film except each electrode extraction hole at the time of the RIE without causing an increase in dimension of each of first and second extraction holes due to etching of the protection film using the etching residue removing aqueous solution, and film reduction or the like of the GaN layer (or the transparent electrode layer of the second conductivity type) exposed at each of the first and second extraction holes, and achieve cleanliness. Moreover, it is also possible to remove even the fence-like residual substance constituted of an altered layer originating from the resist, reactive gas, constituent element of SiN constituting the protection film, and oxygen, and attached to the inner circumferential surface of each of the first and second extraction holes in such a manner that the residual substance protrudes in the direction to the part at which the resist pattern has existed, and achieve cleanliness.

That is, it is possible, when the treatment using the second etching residue removing aqueous solution is carried out, to remove the residual substance constituted of a polymer and carbonaceous matter originating from the resist, and attached to the surface of the protection film by the oxidation function of the peroxosulfate.

Further, it is possible to remove the residual substance having, for example, a fence-like shape, constituted of an altered layer originating from the resist, reactive gas, constituent element of SiN constituting the protection film, and oxygen, and attached to the inner circumferential surface of each electrode extraction hole in such a manner that the residual substance protrudes in the direction to the part at which the resist pattern has existed. At this time, by means of the acid for pH adjustment in the aqueous solution concerned, the pH value of the aqueous solution is adjusted to 0 to 3, whereby creation of $HF_2^-$ having strong etching capability from the fluorine-containing compound (for example, hydrofluoric acid) in the aqueous solution is controlled, and the amount of the $HF_2^-$ can be normalized. Hence it is possible to efficiently remove the residual substance while controlling etching of the protection film constituted of, for example, SiN, and exposed at the inner circumferential surface of each of the first and second extraction holes, and the GaN layer (or the transparent electrode layer) exposed at the bottom surface of each of the first and second extraction holes by virtue of the HF having weak etching capability and the appropriate amount of the $HF_2^-$.

Moreover, when the treatment using the second etching residue removing aqueous solution is carried out, the protection film exposed at the inner circumferential surface of each of the first and second extraction holes, and the GaN layer (or the transparent electrode layer) exposed at the bottom surface of each of the first and second extraction holes are also exposed to the aqueous solution, and are subjected to the etching operation by the fluorine-containing compound (for example, hydrofluoric acid) in the aqueous solution concerned. At this time, the protection film exposed at the inner circumferential surface of each of the first and second extraction holes, and the GaN layer (or the transparent electrode layer) exposed at the bottom surface of each of the first and second extraction holes are protected from the hydrofluoric acid by the oxidation function of the peroxosulfate and, as described previously, creation of the $HF_2^-$ having strong etching capability is controlled, and the $HF_2^-$ amount is normalized, and hence it is possible to resolve the disadvantage of suffering from an increase in diameter of each of the first and second extraction holes, film reduction and the like of the GaN layer (or the transparent electrode layer) of the bottom surface of each of the first and second extraction holes.

Therefore, according to the second embodiment, it is possible to provide an electrode on the clean GaN layer of the second conductivity type positioned in the uppermost layer of the LED element structure part, and hence it becomes possible to connect the electrode to the GaN layer concerned with low resistance. It is possible to provide another electrode on the clean contact region of the first conductivity type, and hence it becomes possible to connect another electrode to the contact region concerned with low resistance. Further, it is possible, in addition to the dimension stability of the LED element structure part, to clean the lateral side thereof, and hence the efficiency in injecting electrons from the GaN layer of the first conductivity type (for example, n-type) into the luminous layer, and the efficiency in injecting positive holes from the GaN layer of the second conductivity type (for example, p-type) into the luminous layer are kept at the intended value, and high luminous efficacy can be achieved.

Furthermore, it is possible to clean the inner circumferential surface and the bottom part of each of the first and second extraction holes, and hence when thereafter a second conductivity type electrode to be connected to the GaN layer (or the transparent electrode layer of the second conductivity type) of the second conductivity type of the LED element structure part through the first extraction hole, and a first conductivity type electrode to be connected to the contact region through the second extraction hole are each formed, it is possible to connect each of the electrodes to each of the GaN layer (or the transparent electrode layer of the second conductivity type) of the second conductivity type and the contact region, respectively with low resistance.

Accordingly, it is possible to manufacture an LED device regarding which low resistance connection of the electrode, high reliability, and high luminous efficacy are expected.

Hereinafter, examples of the present invention will be described in detail with reference to the drawings.

Example 1

Figure 1A:
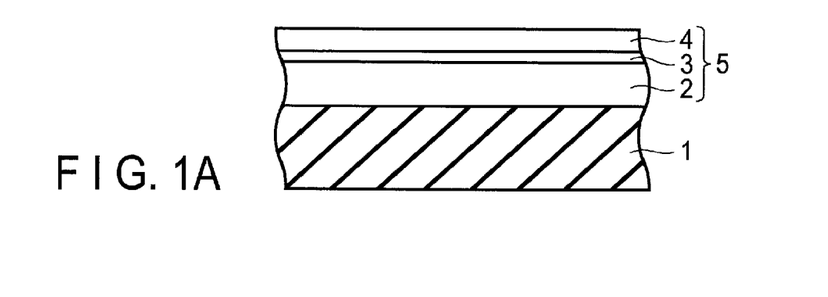
FIGS. 1A, 1B, 1C, 1D, 1E, 1F, 1G, 1H, 1I, 1J, and 1K are cross-sectional views showing manufacturing processes of an LED device of an example.

First, as shown in FIG. 1A, an n-type GaN layer 2, luminous layer 3 constituted of InGaN, and p-type GaN layer 4 were formed on a surface of a sapphire substrate 1 by the epitaxial growth method in the order mentioned, whereby a laminated semiconductor layer 5 was formed.

Figure 1B:
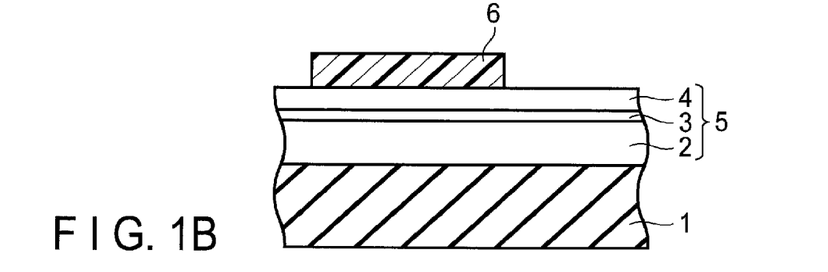
Figure 1C:
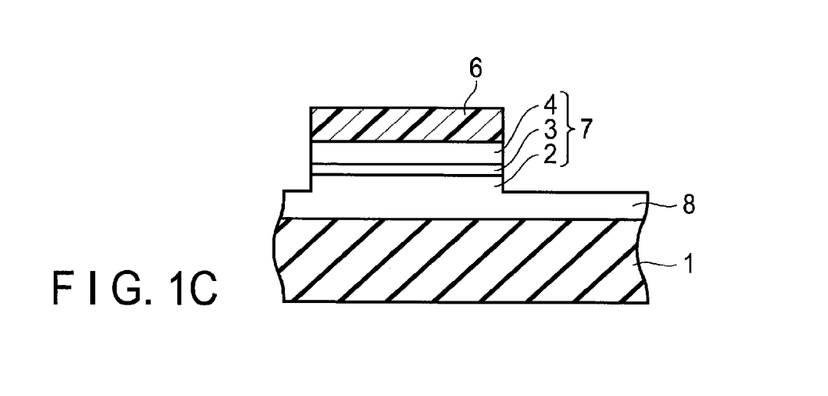
Figure 2:
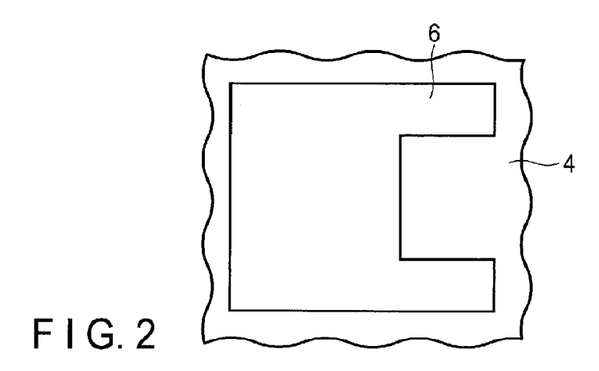
FIG. 2 is a plan view of FIG. 1B.

As shown in FIG. 1B, the surface of the p-type GaN layer 4 of the laminated semiconductor layer 5 was coated with a resist film, and the resist film was treated by the so-called photoetching method (photolithographic process) by which the resist film was subjected to exposure and development processing, whereby a resist pattern 6 was formed. This resist pattern 6 has, as shown in FIG. 2, a planar shape having a rectangular external shape and formed by rectangularly cutting away part of the right side thereof toward the center. Subsequently, the laminated semiconductor layer 5 was selectively removed by being subjected to reactive ion etching (RIE) using, for example, a reactive gas of chlorine, and using the resist pattern 6 as a mask so that the n-type GaN layer 2 of the laminated semiconductor layer 5 remains to have a predetermined thickness (for example, 2/3 of the original thickness) on the surface of the substrate 1. By such a process, as shown in FIG. 1C, a rectangular LED element structure part 7 constituted of the n-type GaN layer 2, luminous layer 3, and p-type GaN layer 4, and a rectangular electrode connection region (contact region) 8 integrated with the n-type GaN layer 2 of the LED element structure part 7 were formed on the substrate 1. That is, the LED element structure part 7 has a rectangular external shape similarly to the resist pattern 6 shown in FIG. 2, and the contact region 8 has a rectangular shape formed by cutting away part of the right side of the LED element structure part 7 toward the center.

Figure 1D:
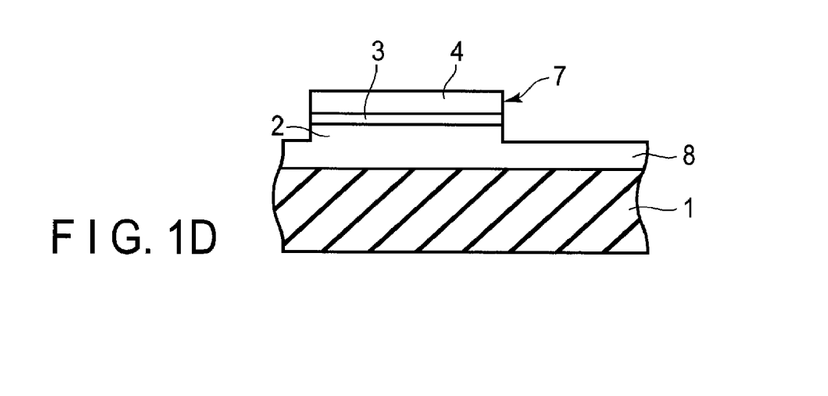
Figure 3:
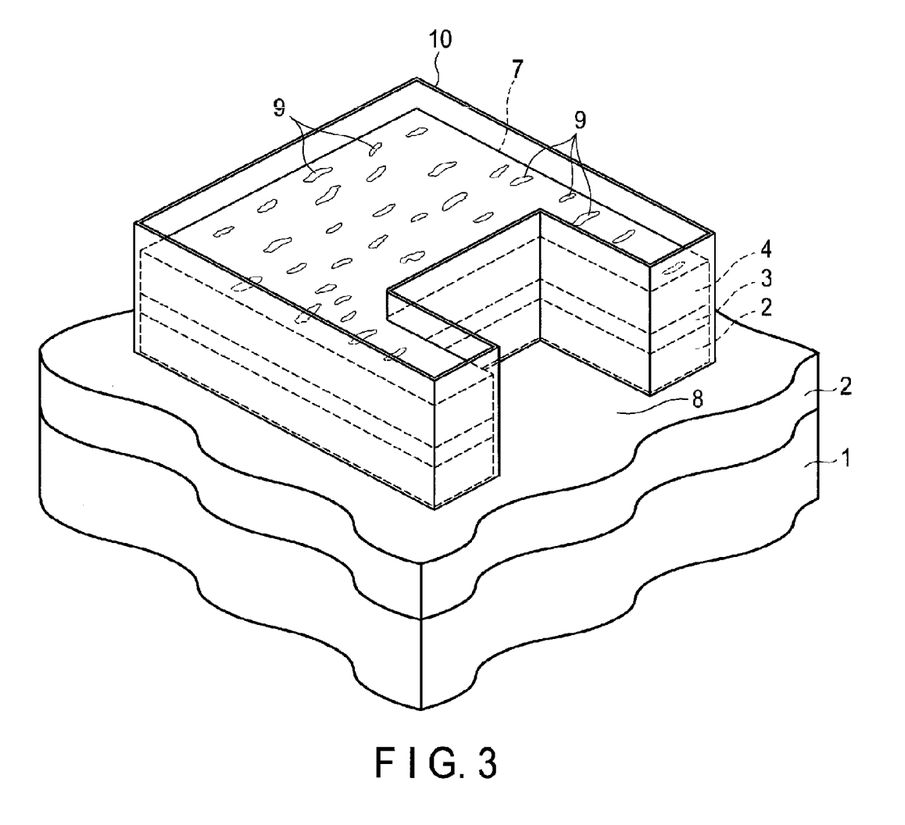
FIG. 3 is a perspective view showing a state at the time when a resist pattern after the process of FIG. 1C is removed.

Subsequently, as shown in FIG. 1D, the resist pattern 6 was removed by, for example, oxygen ashing. After the resist pattern was removed, as shown in FIG. 3, a residual substance 9 fine and having a long and thin shape, and constituted of a polymer and carbonaceous matter mainly originating from the resist was attached to the surface of the p-type GaN layer 4 in the uppermost layer of the LED element structure part 7 which had been covered with the resist pattern. Further, a fence-like residual substance 10 constituted of an altered layer originating from the resist, reactive gas ($Cl_2$), constituent element of GaN, and oxygen was attached to the lateral side (etching surface) of the rectangular LED element structure part 7 in such a manner that the residual substance 10 protruded in the direction to the part at which the resist pattern had existed.

Subsequently, the sapphire substrate 1 including the rectangular LED element structure part 7 and the contact region 8 was treated with a first etching residue removing aqueous solution containing 0.4 mol/L of ammonium peroxodisulfate, $5 \times 10^{-4}$ mol/L of hydrofluoric acid, and sulfuric acid for pH adjustment, and having a pH value of 0.20.

Figure 4:
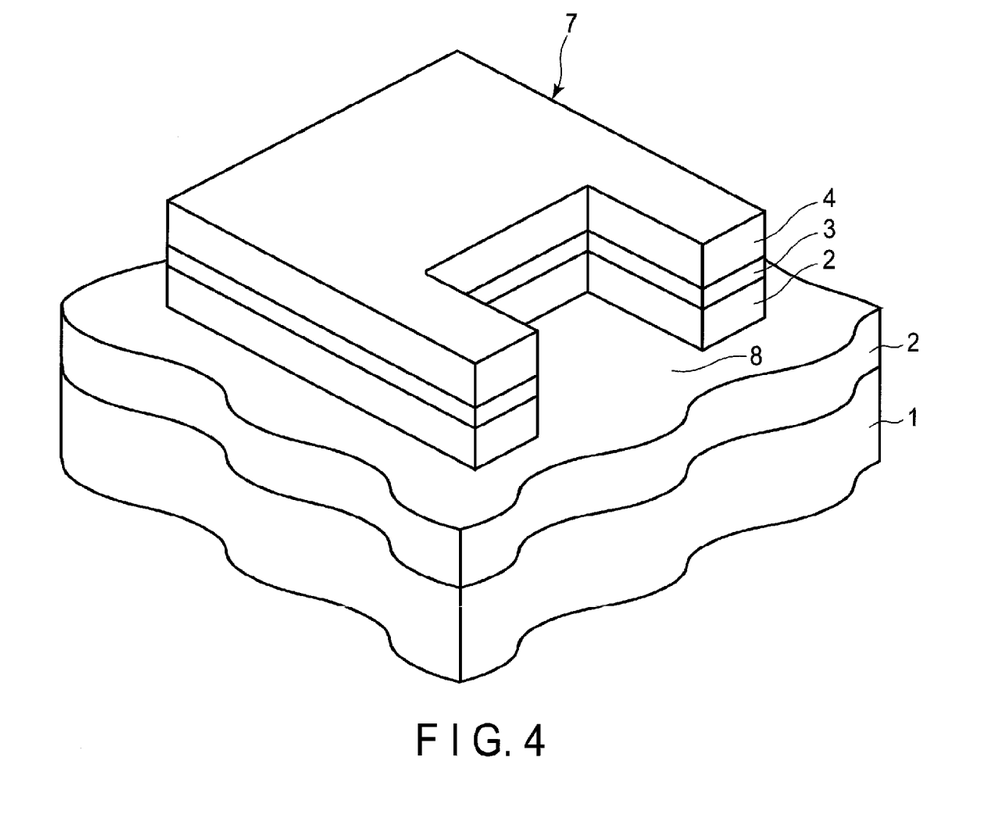
FIG. 4 is a perspective view showing a state at the time when treatment using an etching residue removing aqueous solution is carried out after the process of FIG. 1C.

By the above treatment using such an etching residue removing aqueous solution, as shown in FIG. 4, the residual substance 9 fine and having a long and thin shape originating from the resist, and attached to the surface of the p-type GaN layer 4 in the uppermost layer of the LED element structure part 7 was removed, furthermore the fence-like residual substance 10 constituted of the altered layer, and attached to the lateral side of the LED element structure part 7 was removed, and cleanliness was achieved. Further, etching of the p-type GaN layer 4 in the uppermost layer of the LED element structure part 7, the n-type GaN layer 2, luminous layer 3, and p-type GaN layer 4 which are exposed at the lateral side of the LED element structure part 7, and the contact region 8 constituted of the n-type GaN layer 2 was not observed at all.

Furthermore, after the treatment using the first etching residue removing aqueous solution, although rinsing treatment was carried out by using pure water, the etching residue removing aqueous solution could be washed away without the LED element structure part 7 and the contact region being etched.

Figure 1E:
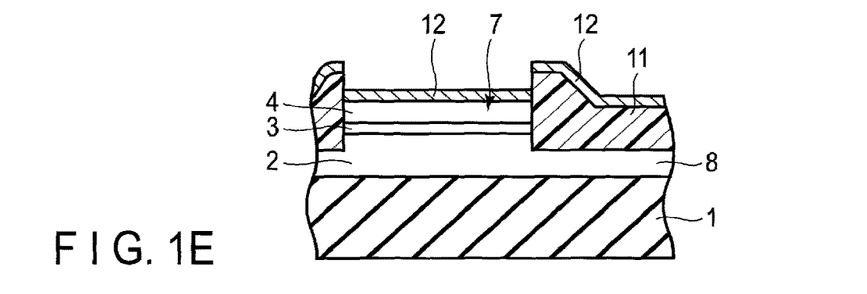
Figure 1F:
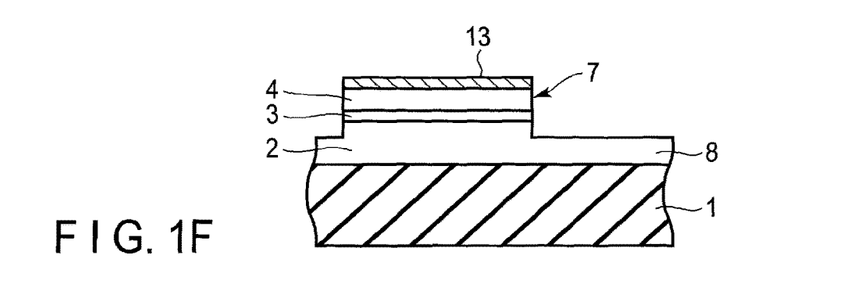

Subsequently, the entire surface was coated with a resist film, and a resist pattern 11 in which a part corresponding to the p-type GaN layer 4 of the uppermost layer of the LED element structure part 7 is opened was formed by the so-called photoetching method by which the resist film was subjected to exposure and development processing. Subsequently, a p-type transparent electrode material layer 12 constituted of ITO was deposited on the surface of the resist pattern 11 by, for example, the sputtering deposition method. At this time, as shown in FIG. 1E, there was a discontinuous stepwise break between the p-type transparent electrode material layer 12 part on the p-type GaN layer 4 in the uppermost layer of the LED element structure part 7 and exposed from the resist pattern 11, and the p-type transparent electrode material layer 12 part on the resist pattern 11. Thereafter, the resist pattern 11 was removed, and by lifting off the p-type transparent electrode material layer 12 part on the resist pattern 11, a p-type transparent electrode layer 13 was formed on the surface of the p-type GaN layer 4 of the uppermost layer of the LED element structure part 7 as shown in FIG. 1F.

Figure 1G:
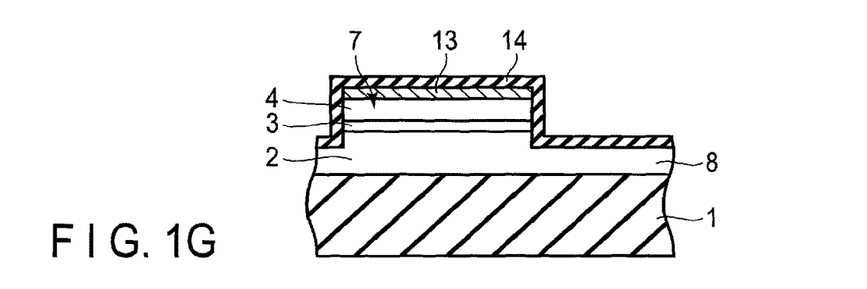
Figure 1H:
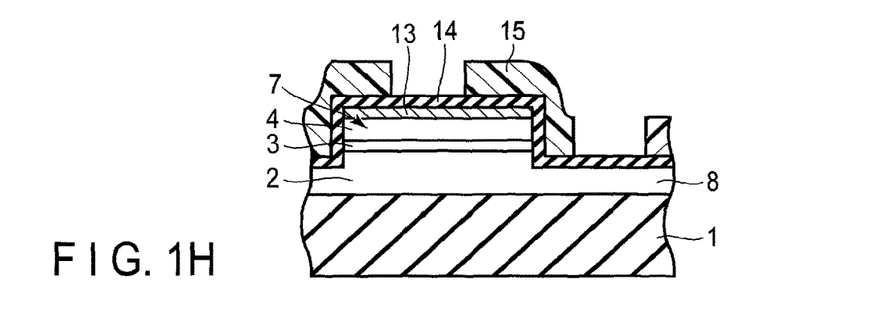

As shown in FIG. 1G, a SiN film 14 serving as a protection film was deposited on the entire surface by the sputtering method. Subsequently, the surface of the SiN film 14 was coated with a resist film, and the resist film was treated by the so-called photoetching method by which the resist film was subjected to exposure and development processing, and a resist pattern 15 in which a part corresponding to part of the p-type transparent electrode layer 13 on the LED element structure part 7, and a part corresponding to part of the contact layer 8 are opened was formed as shown in FIG. 1H.

Figure 1I:
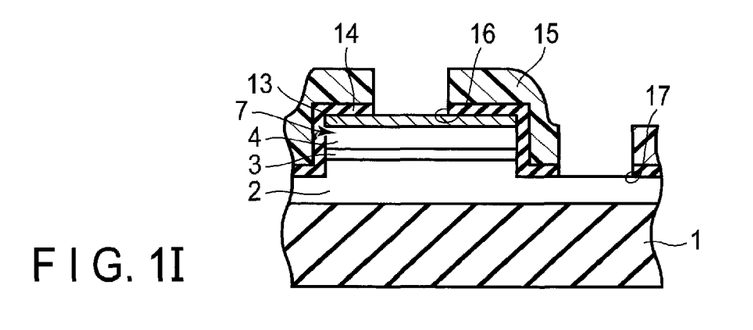

Subsequently, RIE using the resist pattern 15 as a mask, and using sulfur fluoride ($SF_6$) was carried out to selectively remove the SiN film 14. As a result, a first extraction hole 16a for p-type electrode having, for example, a circular shape was formed in the SiN film 14 positioned on part of the transparent electrode layer 13 of the LED element structure part 7 as shown in FIG. 1I. At the same time, a second extraction hole 17 for an n-type electrode having, for example, a circular shape was formed in the SiN film 14 positioned on part of the contact region 8.

Figure 1J:
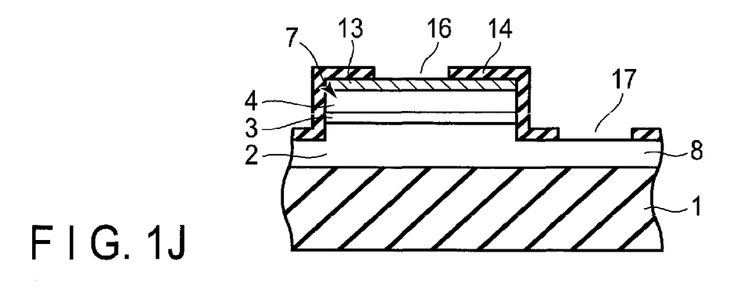

As shown in FIG. 1J, the resist pattern 15 was removed by, for example, oxygen ashing. After the resist pattern was removed, a residual substance (not shown) having a fine, a long and a thin shape, and constituted of a polymer and carbonaceous matter mainly originating from the resist was attached to the surface of the SiN film 14 which had been coated with the resist pattern 15. Further, a fence-like residual substance (not shown) constituted of an altered layer originating from the resist, reactive gas ($SF_6$), constituent element of SiN, and oxygen was attached to the inner circumferential surface (etching surface) of each of the first and second extraction holes 16 and 17 in such a manner that the residual substance protruded in the direction to the part at which the resist pattern had existed.

Subsequently, the SiN film 14 including the first and second extraction holes 16 and 17 was treated with a second etching residue removing aqueous solution containing 0.2 mol/L of ammonium peroxodisulfate, $5\times10^{-4}$ mol/L of hydrofluoric acid, and sulfuric acid for pH adjustment, and having a pH value of 0.20.

By the above treatment using the second etching residue removing aqueous solution like this, the residual substance having a fine, a long and a thin shape, originating from the resist, and attached to the surface of the SiN film 14 was removed, furthermore the fence-like residual substance constituted of an altered layer, and attached to the inner circumferential surface of each of the first and second extraction holes 16 and 17 was removed, and cleanliness was achieved. Further, etching on the surface of the SiN film 14 and part of the SiN film 14 exposed at the inner circumferential surface of each of the first and second extraction holes 16 and 17 was not observed at all.

Furthermore, after the treatment using the second etching residue removing aqueous solution, although rinsing treatment was carried out by using pure water, the second etching residue removing aqueous solution could be washed away without the surface of the SiN film 14 and part of the SiN film 14 exposed at the inner circumferential surface of each of the first and second extraction holes 16 and 17 being etched.

Figure 1K:
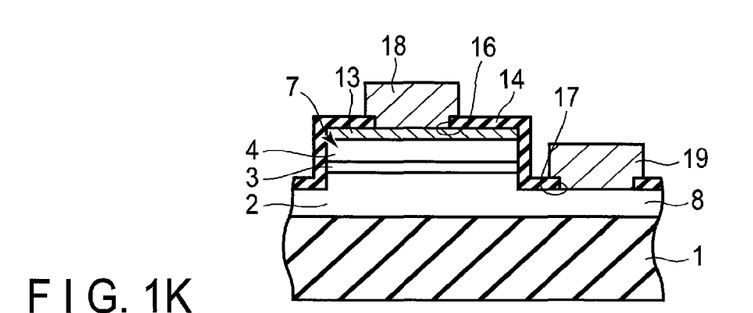
Figure 5:
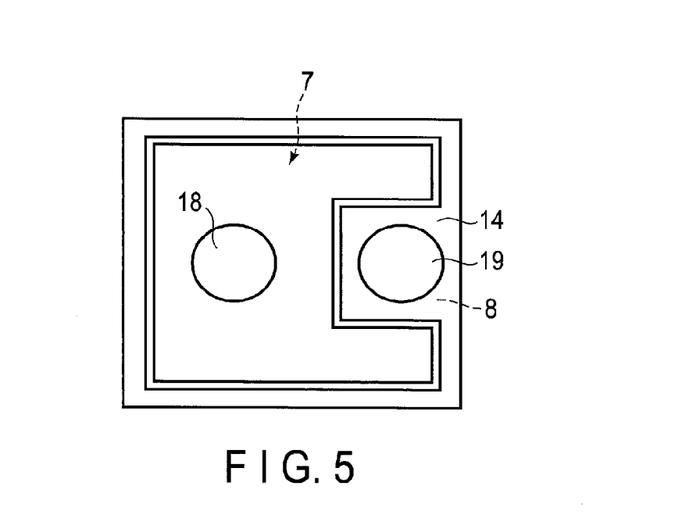
FIG. 5 is a plan view of FIG. 1K.

Subsequently, a p-type electrode material layer having a layered structure of Al/Ti/Pt/Au was vapor-deposited on the entire surface by sputtering, and the p-type electrode material layer was subjected to patterning according to the ordinary procedure, whereby a circular p-type electrode 18 connected to the p-type transparent electrode layer 13 on the LED element structure part 7 through the first extraction hole 16 was formed. Subsequently, an n-type electrode material layer having a layered structure of Ti/Pt/Au was vapor-deposited on the entire surface by sputtering, and the n-type electrode material layer was subjected to patterning according to the ordinary procedure, whereby an n-type electrode 19 connected to the contact region 8 through the second extraction hole 17 was formed. Thereafter, with respect to the LED element structure part 7 and the contact region 8, the peripheral sapphire substrate 1 and the n-type GaN layer 2 on the substrate 1 were subjected to scribing, whereby an LED device shown in FIG. 1K and FIG. 5 was manufactured. It should be noted that FIG. 5 is a plan view of FIG. 1K.

It should be noted that in the example 1, after carrying out the processes (two treatment processes) for ashing-removing the resist pattern, in place of the first and second etching residue removing aqueous solutions, and as a comparative example 1, treatment was carried out by using Clean Strip MF (trade name of the product of Tokyo Ohka Kogyo Co., LTD.) containing an aromatic hydrocarbon, alkylbenzene sulfonic acid, and nonyl phenol for each process.

As a result, in the first treatment process, although the residual substance having a fine, a long and a thin shape originating from the resist, and attached to the surface of the p-type GaN layer in the uppermost layer of the LED element structure part could be removed, the fence-like residual substance constituted of an altered layer, and attached to the lateral side of the LED element structure part could not sufficiently be removed, and part of the residual substance remained at the bottom part of the lateral side of the LED element structure part.

Further, in the second treatment process, although the residual substance having a fine, a long and a thin shape, originating from the resist, and attached to the surface of the SiN film could be removed, the fence-like residual substance constituted of an altered layer, and attached to the inner circumferential surface of each of the first extraction hole for p-type electrode and the second extraction hole for n-type electrode could not sufficiently be removed, and part of the residual substance remained at the bottom part of the inner circumferential surface of each of the first and second extraction holes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing an LED device comprising:
    forming a laminated semiconductor layer including a GaN layer of a first conductivity type, a GaN-based luminous layer, and a GaN layer of a second conductivity type stacked in this order on a surface of a substrate;
    forming a resist pattern with a predetermined shape on the laminated semiconductor layer;
    subjecting the laminated semiconductor layer to reactive ion etching using the resist pattern as a mask to selectively remove the laminated semiconductor layer so that the GaN layer of the first conductivity type remains to have a predetermined thickness on a surface of the substrate, thereby forming an LED element structure part and an electrode connection region integrated with the GaN layer of the first conductivity type of the structure part on the substrate;
    removing the resist pattern; and
    treating the substrate including the LED element structure part and the electrode connection region with a first etching residue removing aqueous solution containing a peroxosulfate, a fluorine-containing compound, and an acid for pH adjustment, and possessing a pH value of 0 to 3.

2. The method of claim 1, wherein the substrate is a sapphire substrate.

3. The method of claim 1, wherein a reactive gas to be used when the laminated semiconductor layer is subjected to reactive ion etching is a chlorine-based gas.

4. The method of claim 1, wherein the peroxosulfate in the first etching residue removing aqueous solution is ammonium peroxodisulfate.

5. The method of claim 4, wherein the ammonium peroxodisulfate is contained in the first etching residue removing aqueous solution at a concentration of 0.01 mol/L to 20 mol/L.

6. The method of claim 1, wherein the fluorine-containing compound is contained in the first etching residue removing aqueous solution at a concentration of $1\times10^{-4}$ mol/L to $1\times10^{-2}$ mol/L.

7. The method of claim 1, wherein the acid for pH adjustment is sulfuric acid.

8. The method of claim 1, wherein the liquid temperature of the first etching residue removing aqueous solution is 20 to 35° C.

9. The method of claim 1, further comprising, after the treatment using the first etching residue removing aqueous solution, carrying out rinsing treatment using a water-soluble organic solvent or pure water.

10. A method for manufacturing an LED device comprising:
    forming a laminated semiconductor layer including a GaN layer of a first conductivity type, a GaN-based luminous layer, and a GaN layer of a second conductivity type stacked in this order on a surface of a substrate;
    forming a resist pattern with a predetermined shape on the laminated semiconductor layer;
    subjecting the laminated semiconductor layer to reactive ion etching using the resist pattern as a mask to selectively remove the laminated semiconductor layer so that the GaN layer of the first conductivity type remains to have a predetermined thickness on a surface of the substrate, thereby forming an LED element structure part and an electrode connection region integrated with the GaN layer of the first conductivity type of the structure part on the substrate;
    removing the resist pattern;
    treating the substrate including the LED element structure part and the electrode connection region with a first etching residue removing aqueous solution containing a peroxosulfate, a fluorine-containing compound, and an acid for pH adjustment, and possessing a pH value of 0 to 3;
    forming a protection film on the entire surface of the LED element structure part including the electrode connection region;
    forming a resist pattern in which a part corresponding to part of the GaN layer of the second conductivity type of the LED element structure part, and a part corresponding to part of the electrode connection region are opened on the surface of the protection film, on the LED element structure part including the electrode connection region;
    subjecting the protection film to reactive ion etching using the resist pattern as a mask to selectively remove the protection film, thereby forming a first extraction hole for a second conductivity type electrode in the protection film on the GaN layer of the second conductivity type of the LED element structure part, and forming a second extraction hole for a first conductivity type electrode in the protection film on the electrode connection region;
    removing the resist pattern;
    treating the protection film including the first and the second extraction holes with a second etching residue removing aqueous solution containing a peroxosulfate, a fluorine-containing compound, and an acid for pH adjustment, and possessing a pH value of 0 to 3; and
    forming a second conductivity type electrode to be connected to the GaN layer of the second conductivity type of the LED element structure part through the first extraction hole and a first conductivity type electrode to be connected to the electrode connection region through the second extraction hole.

11. The method of claim 10, wherein the substrate is a sapphire substrate.

12. The method of claim 10, wherein a reactive gas to be used when the laminated semiconductor layer is subjected to reactive ion etching is a chlorine-based gas.

13. The method of claim 10, wherein each of the peroxosulfates in the first and second etching residue removing aqueous solutions is ammonium peroxodisulfate.

14. The method of claim 13, wherein the ammonium peroxodisulfate is contained in each of the first and second etching residue removing aqueous solutions at a concentration of 0.01 mol/L to 20 mol/L.

15. The method of claim 10, wherein the fluorine-containing compound in each of the first and second etching residue removing aqueous solutions is contained in each of the first and second etching residue removing aqueous solutions at a concentration of $1 \times 10^{-4}$ mol/L to $1 \times 10^{-2}$ mol/L.

16. The method of claim 10, wherein each of the acids for pH adjustment in the first and second etching residue removing aqueous solutions is sulfuric acid.

17. The method of claim 10, wherein the liquid temperature of each of the first and second etching residue removing aqueous solutions is 20 to 35° C.

18. The method of claim 10, further comprising, after each of the treatment processes using the first and second etching residue removing aqueous solutions, further carrying out rinsing treatment using a water-soluble organic solvent or pure water.

19. The method of claim 10, further comprising, after the treatment using the second etching residue removing aqueous solution, and before forming the protection film, further forming a transparent electrode layer of the second conductivity type on the surface of the GaN layer of the second conductivity type of the LED element structure part.

* * * * *